United States Patent [19]
Sheu et al.

[11] Patent Number: 5,597,753
[45] Date of Patent: Jan. 28, 1997

[54] CVD OXIDE CODING METHOD FOR ULTRA-HIGH DENSITY MASK READ-ONLY-MEMORY (ROM)

[75] Inventors: Shing-Ren Sheu, Tao-Yuan; Kuan-Cheng Su, Taipei; Chen-Hui Chung, Hsin-Chu; Yi-Chung Sheng, Tai-chung, all of Taiwan

[73] Assignee: United Microelectronics Corporation, Hsin-Chu, Taiwan

[21] Appl. No.: 364,318

[22] Filed: Dec. 27, 1994

[51] Int. Cl.$^6$ .............................................. H01L 21/8246
[52] U.S. Cl. .............................................. 437/52; 437/48
[58] Field of Search ................................ 437/45, 48, 52, 437/235, 238; 148/DIG. 163

[56] References Cited

U.S. PATENT DOCUMENTS

| | | | |
|---|---|---|---|
| 5,081,052 | 1/1992 | Kobayashi | 437/45 |
| 5,091,328 | 2/1992 | Miller | 437/45 |
| 5,117,389 | 5/1992 | Yiu | 365/104 |
| 5,153,146 | 10/1992 | Toyoshima | 437/45 |
| 5,429,974 | 7/1995 | Hsue | 437/45 |

Primary Examiner—Tom Thomas
Attorney, Agent, or Firm—William H. Wright

[57] ABSTRACT

An improved Read-Only-Memory (ROM) structure and a method of manufacturing said ROM device structure having an ultra-high-density of coded ROM cells, was achieved. The array of programmed ROM cells are composed of a single field effect transistor (FET) in each ROM cell. The improved ROM process utilizes the patterning of a ROM code insulating layer over each coded FET (cell) that is selected to remain in an off-state (nonconducting) when a gate voltage is applied. The remaining FETs (cells) have a thin gate oxide which switch to the on-state (conducting) when a gate voltage is applied. The thick ROM code insulating layer eliminates the need to code the FETs in the ROM memory cells by conventional high dose ion implantation. This eliminated the counter-doping of the buried bit lines by the implantation allowing for much tighter ground rules for the spacing between buried bit line. The elimination of the implant also reduces substantially the stand-by leakage current that is so important in battery operated electronic equipment, such as lap-top computers. The gate capacitance of the off-state cells is also substantially reduced because of the thick insulating layer, thereby reducing the RC time delay in the word lines and improving circuit performance.

25 Claims, 8 Drawing Sheets

CVD OXIDE CODING METHOD FOR ULTRA-HIGH DENSITY MASK READ-ONLY-MEMORY (ROM)

BACKGROUND OF THE INVENTION (1) Field of the Invention

The present invention relates to integrated circuit memory devices on a semiconductor substrates, and more particularly to a method for fabricating a ultra high density Read-Only-Memory (ROM) device.

(2) Description of the Prior Art

Read-Only-Memory (ROM) circuits are used extensively in the electronics industry to permanently store information in electronic equipment, such as computers, microprocessor systems and the likes. The information, such as microinstructions, is stored so that the information is available the instant that the equipment, containing the ROM circuit, is turned on.

Memory cells are fabricated on a portion of the ROM device consisting of an array of single transistor, typically field effect transistor (FET), arranged in rows and columns. The array of FETs are built by first forming an array of closely spaced parallel electrically conducting line regions in the substrate called "bit lines". The bit lines serve as the source/drain regions of the FETs, and also serve as the electrical interconnections to the peripheral circuits for outputting the stored binary data. The buried bit lines are usually formed in the substrate by ion implantation and a thermal oxide is then grown on the substrate forming the gate oxide of the FET between the bit lines. The thermal oxide also provides the electrical insulation layer over the bit lines. A plurality of closely spaced parallel conducting line, called "word lines," usually formed from a doped polysilicon layer, are then formed on the substrate having an orthogonal direction to the buried bit lines, for example alone the rows direction. The word lines serve as the gate electrode of the FETs and also function as the electrical interconnection to the peripheral address decode circuit. The array of ROM cells are then coded with information, such as micro-instruction, by permanently rendering selected transistors non-conducting during processing while non-coded cells can be switch on, when accessed by way of the address decode circuits. The coded information represented by a change or no change in the voltage level at the output circuit are used to represent the binary 1's and 0's.

The code for the ROM is introduced during semiconductor processing by using a ROM code mask during one of the processing steps. The presence or absence of the transistor can be achieved by designing the ROM code mask for patterning a diffusion, contacts or metal during ROM device processing. Typically, the patterning and thereby the coding is done at the substrate level, by ion implantation and an activation anneal, to achieve the highest layout density. The patterning at the contact and metal levels are used to achieve the fastest turn-around time to finished product.

For the conventional implantation method of coding, the select FETs receive a high implant dose, thereby increasing the threshold voltage $V_t$, at which the FET turns-on, which is higher than the applied gate voltage $V_g$ that the FET will experience during operation. This makes them permanently non-conductive, and thereby coding the FET on the ROM array. The code implantation is done using a patterned photoresist mask having openings over the FET gate areas selected for coding. A ROM code implant, such as a boron ($B^{11}$) implantation, is formed in the FET channel under the gate electrode. When the chip fabrication is complete, and the gate voltage $V_g$ is applied to the word line over the code implanted region via the address circuit, the high threshold FET in the coded cell does not turn on, and thereby, for example, can be used to represent a binary 0. However, in cell areas that are masked from the implantation, the low P$^-$ doped surface is inverted when a gate voltage $V_g$ is applied and the FET turns on. This provides an electrical conducting path between the source and drain formed from the buried bit lines and thereby can, for example, represents a binary 1.

Unfortunately, when the code implantation is performed the transverse straggle from the implant and the thermal cycle to activate the implanted atoms result in lateral diffusion of the dopant which causes counter-doping of the adjacent buried bit lines. This substantially constricts the width of the buried bit line adjacent to the code implant region and increases substantially the series resistance in the individual bit lines. The problem is further exacerbated if two adjacent memory cells are coded by ion implantation. Therefore, it is necessary to limit the design ground rule for the separation between adjacent bit lines in order to avoid this problem.

Another problem occurs because the ROM code implant mask is optically aligned to the polysilicon gate (word line) and not to the bit line, therefore, the indirect alignment requires additional relaxation of the design ground rules.

Still another problem occurs with the ROM code implantation technology. The code implantation necessary for the high $V_t$ must also provide excellent electrical isolation between adjacent buried bit lines. However, the highly doped implanted channel under the coded FET results in a lower junction breakdown voltage and more importantly to very high leakage currents between adjacent bit lines. The high leakage current result in very high standby currents, thereby substantially reducing the useful operating time of battery operated equipment, such as in lap top computers.

One method of improving the performance of read-only memory is described by T. D. H. Yiu, in U.S. Pat. No. 5,117,389 in which design changes form subarrays of memory cells that are selected by block select transistors and share a common metal bit line to reduce the bit line resistance. Although the circuit performance is improved, the semiconductor processing is substantially more complex and the increase in packing density of the ROM cells is not necessary improved.

Therefore, there is still a strong need in the semiconductor industry to minimize the resistance of the bit line, minimize the standby current while increasing the ROM cell density on the substrate without substantially increasing the process complexity.

SUMMARY OF THE INVENTION

It is the principle object of this invention to provide a method for forming a new ROM circuit device having increased ROM cell density and low standby current without increasing the resistance of the bit lines.

It is another object of this invention to provide the above advantages by forming a thick insulating oxide over the coded cell FETs of the ROM array by a method of patterning a chemical vapor deposited (CVD) oxide.

It is still another object of the invention to form these ROM circuits without increasing the process masking levels, and thereby providing a cost effective ROM product.

In accordance with the objectives of this invention a method is provided for manufacturing an improved ultra high density mask ROM semiconductor device in and on a semiconducting substrate. The method begins by providing a semiconductor substrate, such as a P⁻ doped single crystal silicon having a <100> crystallographic orientation. Device device areas are provided on the substrate, portions of which are used to form peripheral decode address circuits and data output circuits by conventional means. Other portions of the device areas are used to fabricate, during processing, the ultra-high density array of coded ROM memory cells, also referred to simply as coded cells or coded ROM cells in this invention.

The array of memory cells for the ROM device, consisting of single FETs, are fabricated by first forming an array of parallel buried bit lines having a first direction in a portion of the substrate surface using a patterned photoresist mask and ion implantation. The bit lines being ion implanted with an N+ type dopant, such as arsenic ($As^{75}$) or phosphorus ($P^{31}$) ions. Portions of the bit lines form the source/drain areas of the individual FETs used in each of ROM cells. The substrate is then deposited with a ROM code insulating layer, for example, such as a chemical vapor deposited (CVD) silicon oxide ($SiO_2$) and then patterned by plasma etching using a ROM code mask, composed of a patterned photoresist layer. The photoresist is removed leaving portions of the ROM code insulating layer aligned over coded cell areas between the buried bit lines. The patterned code insulating layer of this invention is important because it eliminates the need for a conventional code implant step that otherwise limits the reduction in design ground rule spacings between bit lines and would also increase the standby current of the completed ROM device.

A thermal oxide is now grown on the exposed surface of the substrate, and thereby forming a thin gate oxide between the buried bit lines and a somehwat thicker insulating oxide over the buried bit line.

A polysilicon or polycide layer is deposited on the substrate and conventional lithographic techniques and plasma etching is used to form an array of parallel, closely spaced word lines. The array of word lines are formed in a second direction which is orthogonal to the buried bit lines and are aligned over the patterned ROM code insulating layer. The portions of the word lines over the gate oxide areas form a series of gate electrodes for the single FETs in each of the coded ROM cells, and thereby completes the formation of the ultra-high density array of coded ROM cells of this invention.

The relatively thick code insulating layer formed by patterning the CVD silicon oxide layer over the selected ROM cells areas provide a very important function of the invention. The thick code insulating layer on the selected FETs increase the threshold voltage ($V_t$) of the FET preventing the FET from turning on (conducting) when a gate voltage $V_g$, that is less than $V_t$, is applied to the word line, and thereby, for example, can represent a coded binary zero (0), while in the coded cells having a thin gate oxide and a low $V_t$, that is $V_t$ is less $V_g$, the FETs are allowed to turn on (conduct), and thereby, for example, can represent a coded binary one (1).

The ROM coding using the patterned code insulation layer, of this invention, composed of for example of CVD silicon oxide, instead of coding by ion implantation eliminates the counter-doping of the bit lines which would otherwise require wider spacing between buried bit lines to avoid the increase in series resistance of the bit line and degrade the circuit performance. Furthermore, the elimination of the high dose implant also significantly reduces the standby current of the ROM device when the ROM circuit is powered up. The reduced capacitance of the coded cells with the thick ROM code insulating layer result in reduced RC time constants for the word lines, and thereby resulting in improved circuit performance.

BRIEF DESCRIPTION OF THE DRAWINGS

The object and other advantages of this invention are best explained in the preferred embodiment with reference to the accompanying drawings, in which:

FIGS. 2A through 8A depict schematic cross sectional views of the coded ROM cells for the sequence of process steps of this invention. The cross sections are for the ROM cell structure through 8A—8A' as shown in FIG. 1.

FIGS. 2B through 8B depict schematic cross sectional views of the coded ROM cells for the same sequence of process steps as in FIGS. 2A through 8A, but the cross sections are through 8B—8B', as shown in FIG. 1.

DESCRIPTION OF THE PREFERRED EMBODIMENTS

Although the embodiment of this invention describes in detail only the method of fabricating an array of ultra-high-density coded memory cells on a ROM integrated circuit device, it should be well understood by those skilled in the art that by including additional processing steps other semiconductor structures can be included on the substrate. For example, a field oxide structure (not shown) for isolating device areas can be formed on the substrate, leaving device areas on the substrate surface free for fabricating semiconductor devices. For example, the field oxide can be formed by methods commonly used in the semiconductor industry, such as by the LOCal Oxidation of Silicon (LOCOS). The field oxide electrically isolates the device areas wherein FETs, and for the purpose of this invention the array of ultra-high-density Read-Only-Memory (ROM) cells are also formed. In addition, N doped and P doped wells can also be included on the substrate forming, respectively, therein P-channel and N-channel FETs used to fabricate CMOS circuits, as would be required for forming the address decode and output circuits on the ROM integrated circuit.

Figure 1:
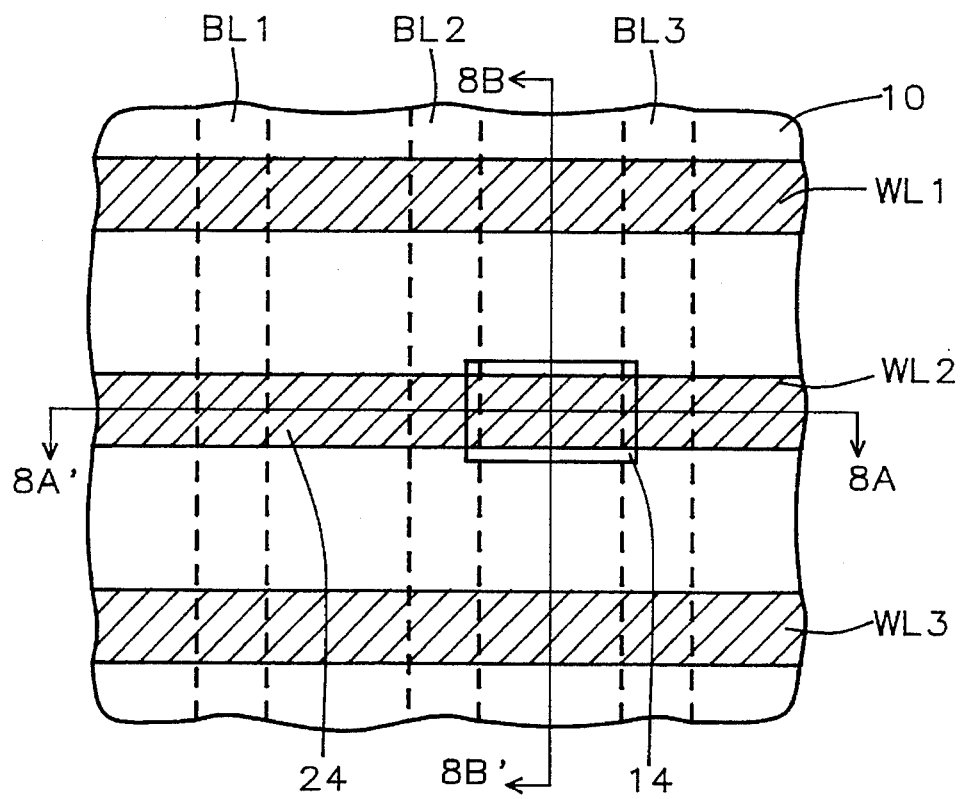
FIG. 1 is a schematic elevational view of a portion of the ultra-high-density array of coded ROM cells on the ROM semiconductor device of this invention. The structure is shown after completing the array of coded ROM cells on the substrate.

Referring now more particularly to FIG. 1, a schematic elevational view is shown. For practical reasons, only a portion of a layout for an array of coded cells on the ROM device of this invention is depicted. The cross section through region 8A—8A' in FIG. 1 is shown for FIGS. 2A through 8A and the cross section through 8B—8B' is shown in FIGS. 2B through 8B. To better understand the invention, a brief overview of the coded cell structure is provided, then the detailed process description is given with reference to FIGS. 2A through 8A and FIGS. 2B through 8B.

As shown in FIG. 1, a portion of an array of buried bit lines, labeled BL1, BL2 and BL3, formed by ion implantation of an N-type dopant, are shown formed in the P⁻ doped substrate 10. The array of buried bit lines form the source/ drains for the individual field effect transistors (FETs) that make up the ROM cells. A relatively thick ROM code insulating layer is then patterned, leaving portion over the particular ROM cells which are selected for coding so as to increase the threshold voltage $V_t$ of the FET and thereby remain in an off-state when a gate voltage $V_g$ is applied. The $V_g$ being less than $V_t$ for that particular FET. One such typical coded cell (FET) is shown in FIG. 1 having a portion of the ROM code insulating layer 14 formed thereon. A silicon oxide layer is then grown by thermal oxidation elsewhere on the substrate, providing the thin gate oxide for the FETs not coded by the patterned layer 14 and having a low threshold voltage $V_t$ which therefore switches to an on-state when a gate voltage $V_g$ ($V_g > V_t$) is applied to the gate electrode. An array of parallel conducting lines forming word lines, for example composed of a $N^+$ doped polysilicon or polycide, is formed in a direction which is orthogonal to the buried bit lines and aligned over the coded cell areas. A portion of the array of word lines are shown in FIG. 1, labeled WL1, WL2 and WL3, with word line WL2 aligned over the coded cell area having layer 14. The portion of the word lines between the bit lines function as the gate electrodes of the individual FETs making up the individual ROM cells. When a gate voltage $V_g$ is applied to the word line, such as WL2, by means of the address decode circuit, the cell having the layer 14 and therefore a high $V_t$ greater than $V_g$ remains in an off-state and can thereby represent a binary zero (0), while other ROM cells having a low $V_t$, such as cell area 24, also shown in FIG. 1, will be switched to an on-state and thereby can represent a binary one (1). The array of ROM cells are then programmed by simply designing a code mask with the desired program code to pattern the ROM code insulating layer 14.

Figure 2A:
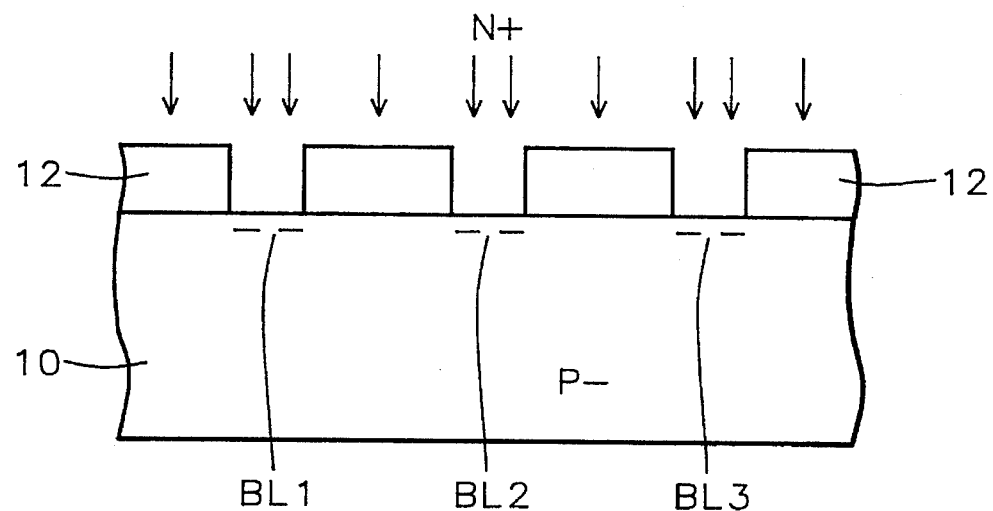

Referring now more specifically to FIGS. 2A through 8A, the details of the new and improved ROM process for manufacturing an array of coded ROM cells is described. The process starts, as shown in FIG. 2A, by providing a semiconductor substrate 10. The preferred substrate is typically composed of a $P^-$ doped single crystal silicon with a <100> crystallographic orientation and doped with, for example, boron (B). The substrate or P-well for fabricating the N-channel FET is typically doped having a concentration of between about 1E14 to 1E15 atoms/cm³. The array of ROM cells having selected cells coded are then fabricated in and on the silicon substrate 10 having portions of the device area therefor allocated.

Figure 2B:
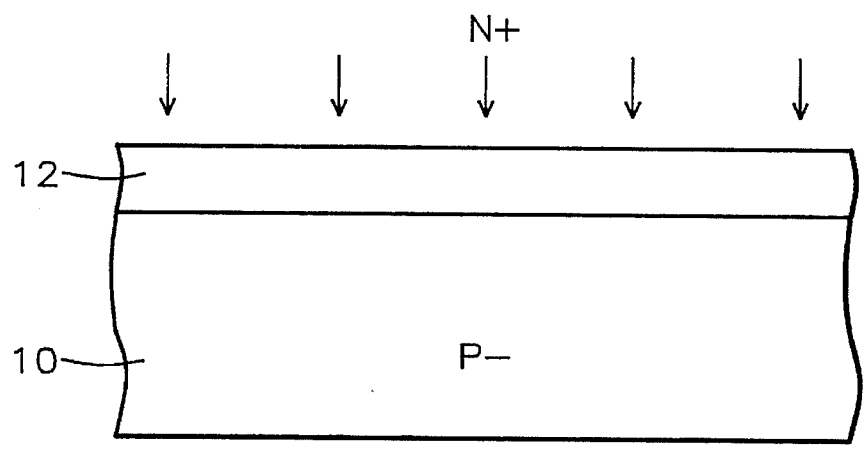

Still referring to FIG. 2A, an array of buried bit lines are now formed in a first direction, three of the plurality of bit lines formed are shown in FIG. 2A, labelled as BL1, BL2 and BL3. Conventional photolithographic methods are used to pattern a photoresist implantation masking layer 12, leaving open areas for implanting the bit lines. Ion implantation is then used to dope the substrate 10 forming a plurality of parallel bit lines, such as BL1, BL2 and BL3 shown in FIG. 2A. The bit lines are preferably doped N-type with arsenic ($As^{75}$) or phosphorus ($P^{31}$) ions having a preferred dose of between about 1E15 to 5E15 ions/cm² and a implant energy of between about 60 to 120 KeV. Also shown in FIG. 2B is a cross section through the region 8B—8B' between the buried bit lines in FIG. 1, where the FET channels are to be formed. After removing the photoresist implantation mask the substrate 10 is thermally annealed to activate the implanted atoms. Typically, after completion of the ROM device processing the metallurgical junction depth ($X_j$) of the bit lines are between about 0.15 to 0.30 micrometers below the substrate surface.

Figure 3A:
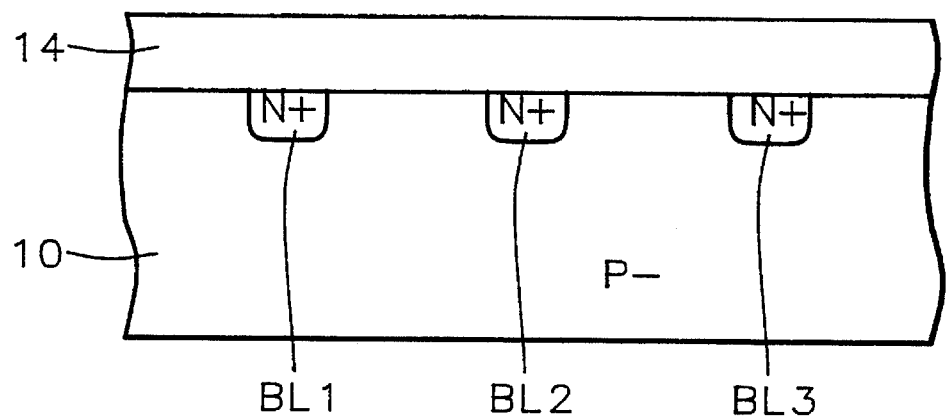
Figure 3B:
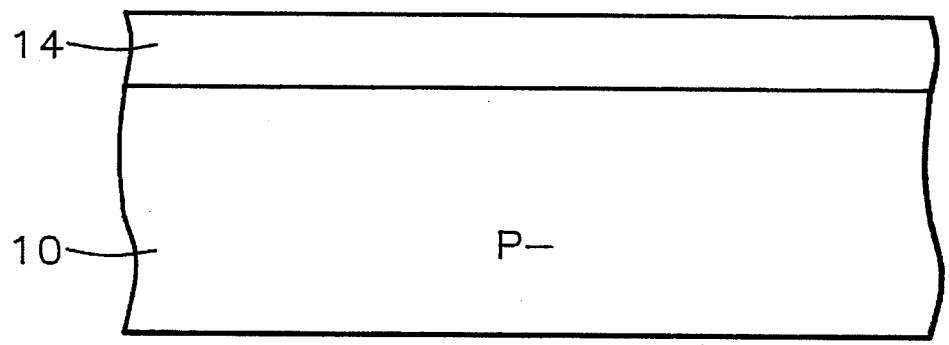

Next as also shown in FIG. 3A, a ROM code insulating layer 14 is blanket deposited on the substrate 10. The preferred layer 14 being composed of silicon oxide and deposited by one of several chemical vapor deposition (CVD) processes. For example, high temperature CVD oxides (about 900° C.) and low temperature CVD oxides (about 300° to 450° C.) can be used. However, oxides formed by thermal oxidations (>900° C.) are preferably avoided so as to provide a good thermal budget (control) without concerns for boron depletion at the substrate surface which can lead to inversion and punchthrough. Furthermore, by avoiding thermal oxidation, threshold voltage shifts that can result on both N and P-channel FETs can also be avoided. For example, more specifically, the preferred deposition can be an Atmospheric Pressure CVD (APCVD), a Low Pressure CVD (LPCVD) or a Plasma Enhanced CVD (PECVD) deposition. For example, at the higher temperatures (near 900° C.) a LPCVD in a reactant gas containing dichlorosilane and nitrous oxide can be used, while at lower temperatures, between about 650° to 800° C., the decomposition of tetraethosiloxane ($Si(OC_2H_5)_4$) can be used to deposit the oxide layer 14. The cross section through B—B' in FIG. 1 is shown in FIG. 3B between the bit lines BL1 and BL2 where the ROM code insulating layer 14 extends over the substrate 10 and where one of the FET in the ROM cell is to be coded by layer 14.

The preferred thickness of the insulating layer 14 is chosen so that the threshold voltage $V_t$ of the FET, in the coded cell is higher than the gate voltage $V_g$ applied to the FET gate electrode (word line). Table I shows some simulated threshold voltages for various silicon oxide thickness having a dielectric constant comparable to oxides grown by thermal oxides.

TABLE I

| GATE OXIDE (ANGSTROMS) | THRESHOLD VOLTAGE (Vt) |
| --- | --- |
| 800 | 5.70 V |
| 500 | 3.90 |
| 300 | 2.50 |
| 135 | 0.95 |

By way of example only, if the ROM integrated circuit is designed to function at gate voltages in the range of 3.3 to 5.0 Volts, then the code insulating layer 14, over the FET should have a corresponding range of thicknesses greater than about 430 to 800 Angstroms to prevent the FET from switching to the on-state when a gate voltage is applied. The coded cell thereby representing, for example, a binary 0.

Figure 4A:
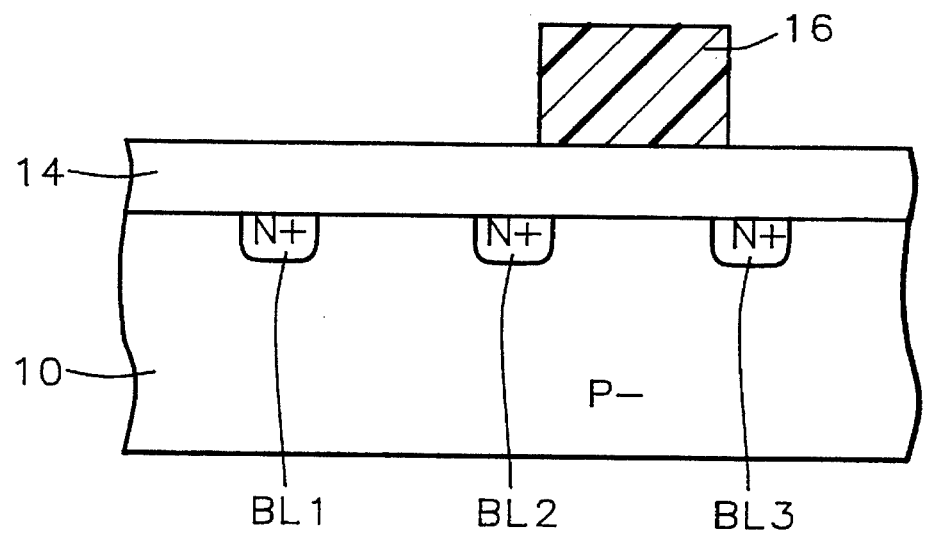
Figure 4B:
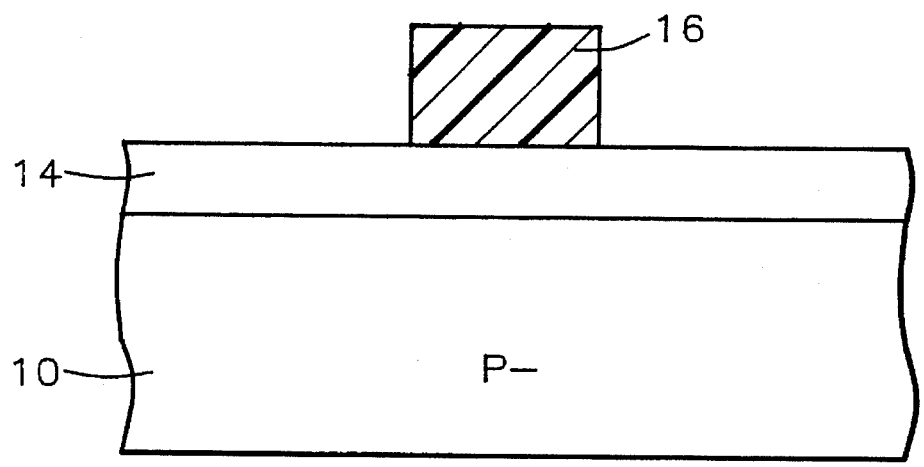
Figure 5A:
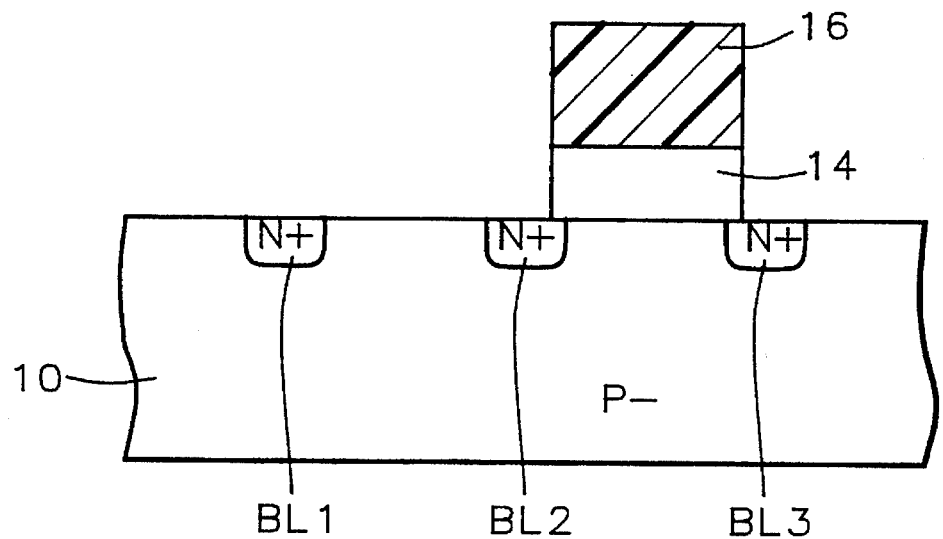
Figure 5B:
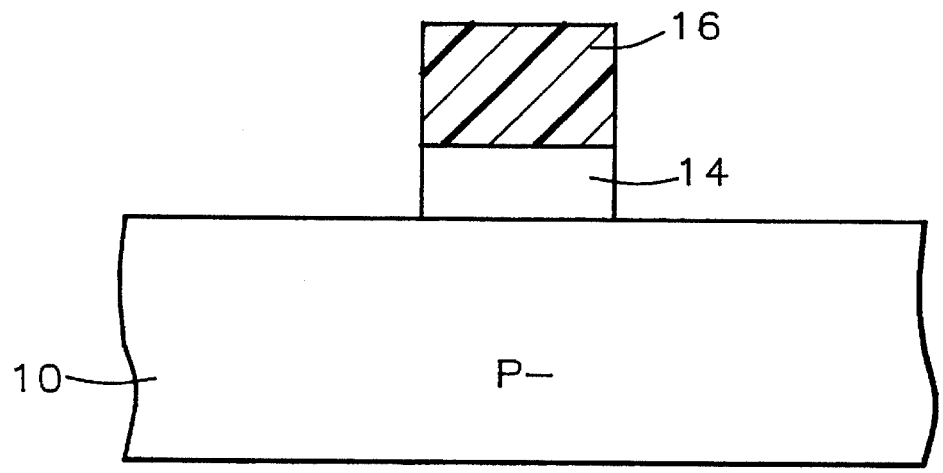

The method for forming the patterned ROM code insulating layer over the selected cells is as follows. As shown in FIG. 4A, a photoresist layer is coated on the ROM code insulating layer 14 and patterned by conventional photolithographic techniques to form the ROM code mask 16. The insulating layer 14 is masked in specific ROM cell areas that are to be coded so that the FETs remains in an off-state (nonconducting) when a gate voltage $V_g$ is applied to the FETs. The insulating layer 14 is then etched, leaving a thick silicon oxide over the ROM coded cells. The preferred etching is an anisotropic etch having a high silicon oxide to silicon etch selectivity. The etch rate ratio of $SiO_2$:Si preferably should be greater than about 10 to 1. For example, the preferred oxide etch can be performed in a gas mixture containing carbon tetrafluoride ($CF_4$) and hydrogen ($H_2$). Alternative, the etching can be performed in a gas mixture containing trifluoromethane ($CHF_3$). Another method of patterning layer 14 is to partially plasma etch the oxide and then to remove the remaining layer by a wet etch, such as in a solution of hydrofluoric acid (HF), if surface damage is a concern. The patterned ROM code insulating layer 14, for one of the coded cells is shown in FIG. 5A, after etching and before removing the photoresist mask 16. The cross section through region 8B—8B', as shown in FIG. 1, is also depicted in FIG. 5B.

Figure 6A:
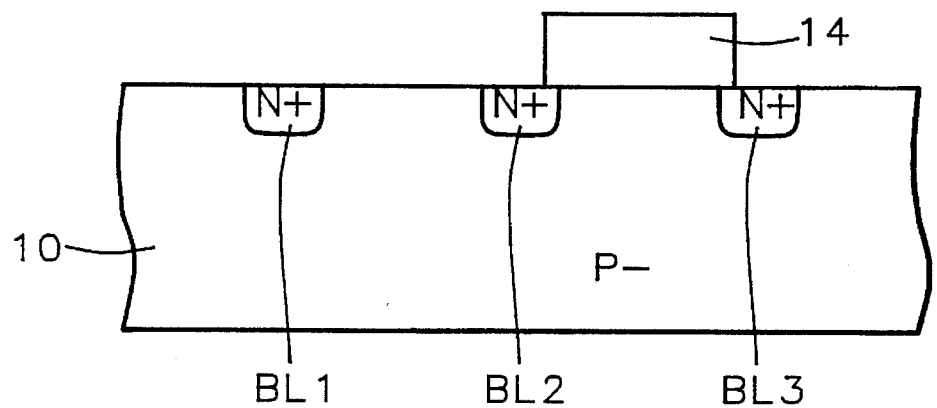
Figure 6B:
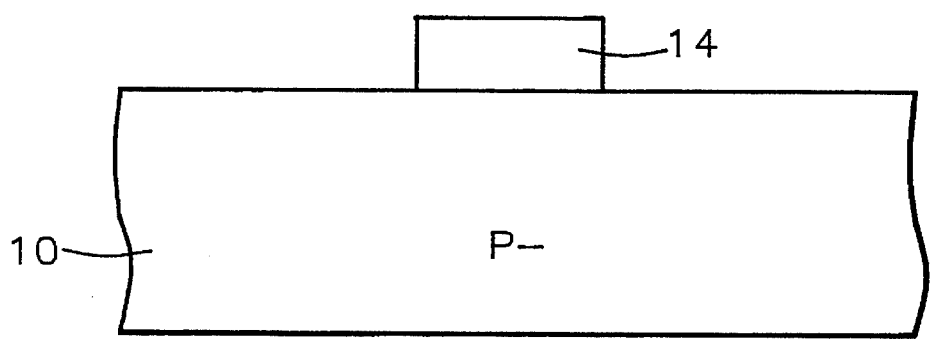

Now as shown in FIG. 6A and FIG. 6B the ROM code photoresist mask 16 is stripped by conventional means, and the substrate is then carefully cleaned to remove any contaminants from the exposed silicon surface. The preferred cleaning method is in a cleaning solution composed of ammonium hydroxide ($NH_4OH$), hydrogen peroxide ($H_2O_2$) and water ($H_2O$) for about 30 minutes at a temperature of about 85° C. and then in a solution of hydrochloric acid (HCl), $H_2O_2$ and water for an additional 30 minutes at 85° C.

Figure 7A:
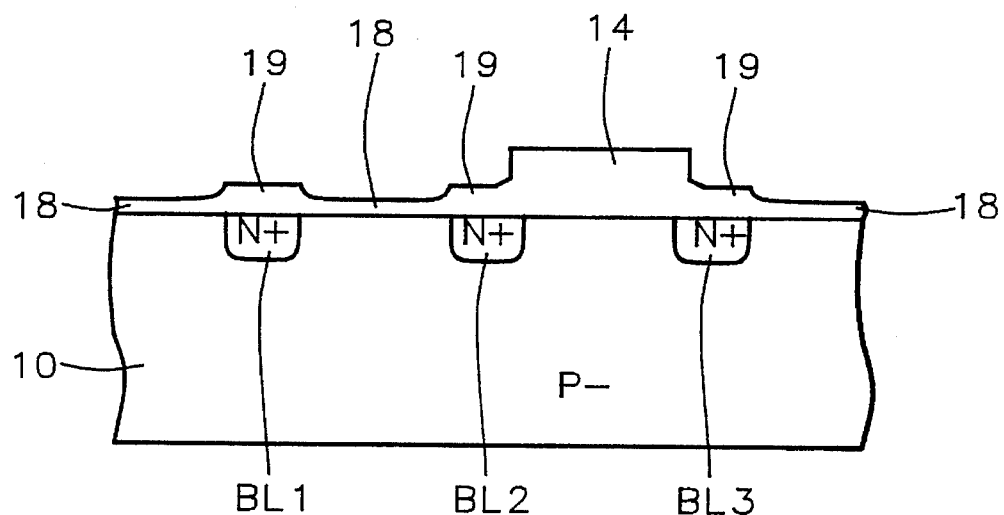
Figure 7B:
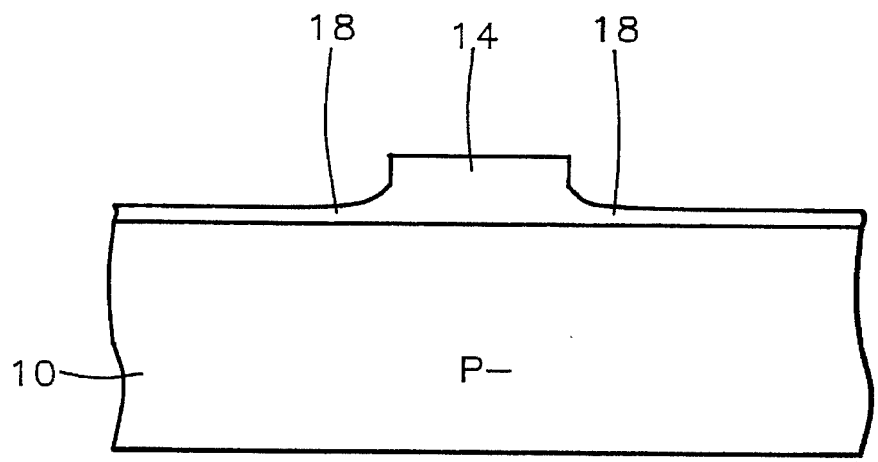

Referring now to FIG. 7A and FIG. 7B, a thin silicon oxide layer 18 is formed on the exposed silicon substrate 10. The preferred oxidation is carried out in an dry oxygen ambient at a temperature of between about 850° to 950° C. The silicon oxide layer 18 forms a gate oxide between the buried bit lines, also labeled 18, as shown in FIGS. 7A and 7B. This provides the gate oxide for FETs in ROM cells that are not coded with the thick insulating layer 14. The gate oxide layer 18 is grown to a preferred thickness of between about 90 to 200 Angstroms so as to have a low threshold voltage $V_t$ of between about 0.6 to 1.0 Volts. The gate voltage $V_g$ is greater than the threshold voltage Vt for the on-state cell with the thin gate oxide, but less than the threshold voltage $V_t$ for the off-state cell with the thick layer 14. Therefore, the method of this invention provides a means to program an array of ROM cells without the need of a ROM code implantation and thereby eliminates the disadvantages associated with the code implantation previously mentioned.

As is well known in the semiconductor industry, heavily doped surfaces have enhanced oxidation rate. Therefore, when the gate oxide 18 is grown between the bit lines the heavily doped buried bit lines have a somewhat thicker silicon oxide layer 19 formed thereon. For example, the oxide layer 19 over the bit lines is typically between about 250 to 800 Angstroms thick when the gate oxide 18 above is formed by thermal oxidation.

Figure 8A:
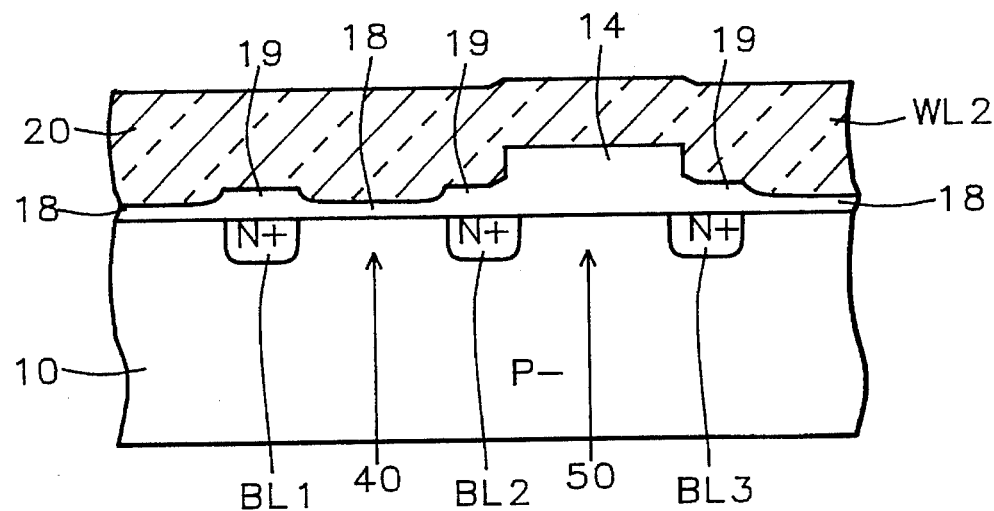
Figure 8B:
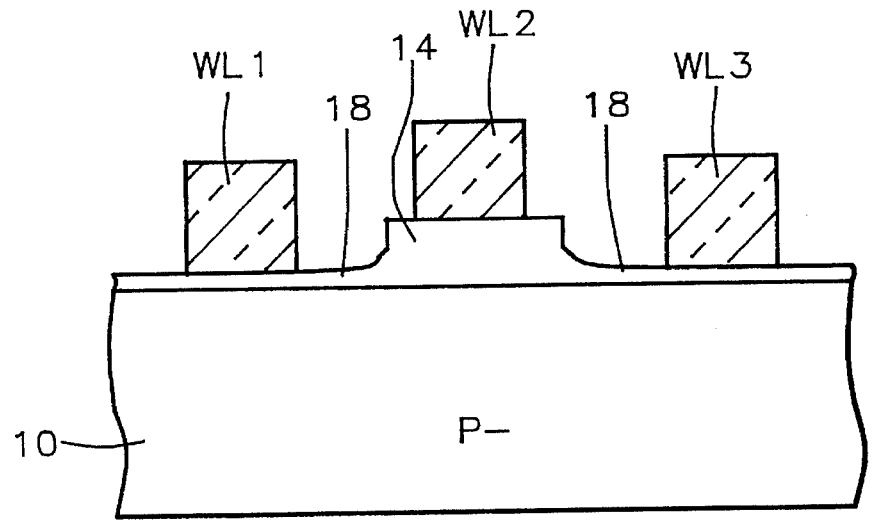

Referring next to FIGS. 8A and 8B, a polysilicon layer 20 is deposited on the substrate and patterned to form parallel, closely spaced array of word lines. Alternatively, a polycide layer comprising of a polysilicon layer and a silicide layer can also be used for layer 20 to improve electrical conductivity and circuit performance. The preferred polysilicon deposition is a Low Pressure Vapor Deposition (LPCVD), for example, using a silane ($SiH_4$) gas, and the preferred thickness is between about 2500 to 4500 Angstroms. The polysilicon layer 20 is then doped with an N type dopant, such as by phosphorus ($P^{31}$) ion implantation. Alternatively, the polysilicon layer can be in situ doped during the low pressure chemical vapor deposition (LPCVD). The preferred phosphorus dopant concentration in polysilicon layer 20 is between about 1E19 to 1E21 atoms/$cm^3$. The polysilicon layer is then patterned by using conventional photolithographic techniques and anisotropic plasma etching. The preferred etching is performed, for example, in a reactive ion etcher (RIE) using a gas mixture having a high selective etch rate of silicon to silicon oxide. For example, a gas mixture of chlorine ($Cl_2$) and a carrier argon (Ar) can be used, alternatively a gas mixture containing other chlorinated gas, such as $CCl_2F_2$ can also be used. If the polycide layer is used then the thickness of the doped polysilicon layer can be reduced to between about 1500 to 3000 Angstroms, and a silicide layer, such as tungsten silicide (WSi) having a thickness of about 1500 Angstroms can be deposited thereon to form layer 20.

The word lines patterned from polysilicon layer 20, shown in FIG. 8B, are formed orthogonal to the buried bit lines BL1, BL2 and BL3, as shown in FIG. 8A, and are aligned to and extending over the cell areas having the gate oxide 18 and are further aligned to and extending over the coded cell areas having the thick ROM code insulating layer 14 and thereby forming an array of electrode gates for the FETs in the ROM cells. The cross section in FIG. 8A is shown for the region 8A—8A' through the word line WL2 of FIG. 1. When a gate voltage $V_g$ is applied to word line WL2, the FET in cell area having the thin gate oxide 18 and low threshold voltage $V_t$, such as cell area 24 in FIG. 1, will switch to the on-state forming a conducting path between bit lines BL1 and BL2, and thereby, for example, representing a binary 1, while the coded cell area which has the thick ROM code layer 14 and the high threshold voltage $V_t$ does not turn on, thereby, representing a binary 0. This completes the method, of this invention for fabricating the array of ultra-high-density coded ROM cells with improved design ground rules, improved performance and low standby leakage current.

Figure 9:
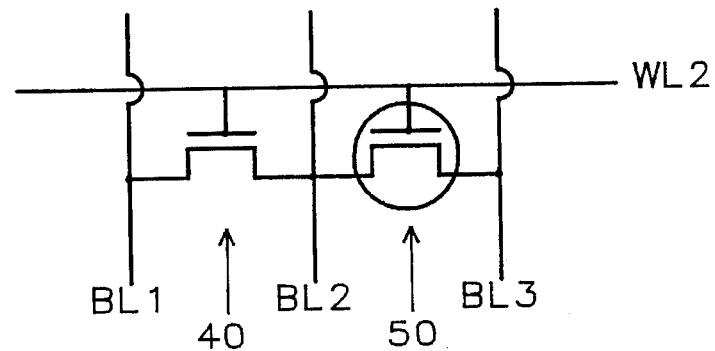
FIG. 9 shows a partial circuit schematic for the two adjacent cells having a thin gate oxide on one cell and a thick ROM code insulator layer on the other cell, as depicted in cross section in FIG. 8A.

For completeness of the description, a partial circuit schematic is shown in FIG. 9 for the two adjacent ROM cells in FIG. 8A. The bit lines BL1, BL2 and BL3 are shown as the vertical wires and the word line WL2 as the horizontal wire in FIG. 9. The FET with low threshold voltage is labeled 40 in FIGS. 9 and 8A and the FET with ROM code layer 14 and high threshold voltage is labeled 50 in FIGS. 9 and 8A.

The ROM integrated circuit is now completed (not shown in any of the Figs.) by depositing an insulating layer over the substrate and thereby insulating the word lines. For example, a low pressure chemical vapor deposited (LPCVD) silicon oxide can be used as the insulating layer. Furthermore, a low flow temperature oxide, such as a borophosphosilicate glass (BPSG) can be used to make a more planar structure. Contact openings are then etched in the insulating layers and patterned interconnecting metallurgy, such as aluminium or aluminium alloys, are used to wire-up, that is, to electrically interconnect the appropriate discrete devices on the ROM integrated circuit device. If necessary, additional insulating layers, contact openings (via holes) and patterned connecting metallurgy process steps can be repeated to complete the ROM integrated circuit.

The method of this invention also provides a new mask alignment sequence which improves the overlay tolerance (tighter ground rules) and thereby further increases the circuit density. A masking and exposure process is briefly described so as to better understand this improvement. A mask or reticle having alignment or registration marks outside the device mask area is stepped across the substrate surface, and the photoresist is optically exposed to form the device images and alignment marks for the integrated circuit. A step and repeat align and expose tool is used for this purpose. The alignment marks are simultaneously formed in the areas between the device or chip areas, usually referred to in the industry as the kerf area. The alignment marks formed in the substrate are then used to align the subsequent mask levels. In the traditional ROM code masking sequence, the ROM code implant mask is aligned indirectly to the alignment marks of the active device area by aligning the ROM code mask to the alignment marks of the polysilicon word line. This requires relaxed ground rules (increased spacings) so as to make allowances for the accumulative tolerance errors in the two levels. In the method of this invention, the ROM code mask for patterning the insulating layer 14, the bit line mask and the polysilicon word line mask are all directly aligned to the active device area alignment marks, and thereby eliminates the indirect alignment of the traditional ROM process and reduces the tolerance and increases device density.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an array of coded memory cells for a Read Only Memory (ROM) semiconductor device on a semiconductor substrate, comprising the steps of:

providing a semiconductor substrate having a principle surface with device areas thereon;

forming by masking and ion implantation an array of parallel buried bit lines oriented in a first direction in a portion of said device areas;

depositing a ROM code insulating layer on said substrate;

forming a ROM code mask on said ROM code insulating layer, said ROM code mask being formed between said buried bit lines and over coded cell areas, leaving exposed said ROM code insulating layer elsewhere on said substrate;

etching said ROM code insulating layer to said substrate, leaving masked portions of said ROM code insulating layer on said coded cell areas;

removing said ROM code mask;

growing a silicon oxide layer on exposed portions of said substrate by thermal oxidation, thereby forming a gate oxide layer between said buried bit lines and an insulating layer over said buried bit lines;

depositing a polysilicon layer over said substrate and in contact with said gate oxide layer;

patterning said polysilicon layer by masking and etching, and forming an array of parallel word lines oriented in a second direction, orthogonal to and above said buried bit lines and aligned over said patterned ROM code insulating layer and thereby completing said array of memory cells having coded cell areas on said ROM semiconductor device.

2. The method of claim 1, wherein said buried bit lines are formed by ion implantation of an N-type dopant having an implant dose of between about 1E15 to 5E15 ions/cm$^2$ and an implant energy of between about 60 to 120 KeV.

3. The method of claim 1, wherein said ROM code insulating layer is a silicon oxide layer formed by chemical vapor deposition having a thickness of between about 300 to 800 Angstroms.

4. The method of claim 1, wherein said ROM code mask is composed of photoresist.

5. The method of claim 1, wherein said insulating layer formed by thermal oxidation between said buried bit lines is between about 90 to 200 Angstroms thick.

6. The method of claim 1, wherein said insulating layer formed by thermal oxidation over said buried bit lines is between about 250 to 800 Angstroms thick.

7. The method of claim 1, wherein said polysilicon layer is heavily doped with N-type dopant atoms having a concentration of between about 1E19 to 1E21 atoms/cm$^3$.

8. The method of claim 7, wherein the thickness of said polysilicon layer is between about 2500 to 4500 Angstroms.

9. The method of claim 7, wherein said polysilicon layer is between about 1000 to 2000 Angstroms thick having a tungsten silicide (WSi) layer on the surface of said polysilicon layer, said WSi having a thickness of between about 1000 to 2000 Angstroms.

10. The method of claim 1, wherein said buried bit lines form the source/drain of field effect transistors (FETs) in the ROM memory cells, and said word lines form gate electrodes of said FETs.

11. The method of claim 1, wherein said patterned ROM code insulating layer is formed in select memory cells to prevent field effect transistors from conducting when a gate voltage is applied to said word lines, and thereby representing a binary zero.

12. A method of fabricating a Read Only Memory (ROM) semiconductor device on a semiconductor substrate having peripheral devices forming address decode circuits and output circuits in device areas and further having coded ROM memory cells, comprising the steps of:

forming by masking and ion implantation an array of parallel buried bit lines oriented in a first direction in a portion of said device areas;

depositing a ROM code insulating layer on said substrate;

forming a ROM code mask on said ROM code insulating layer, said ROM code mask being formed between said buried bit lines and over coded cell areas, leaving exposed said ROM code insulating layer elsewhere on said substrate;

etching said ROM code insulating layer to said substrate, leaving masked portions of said ROM code insulating layer on said coded cell areas;

removing said ROM code mask;

growing a silicon oxide layer on exposed portions of said substrate by thermal oxidation, thereby forming a gate oxide layer between said buried bit lines and an insulating layer over said buried bit lines;

depositing a polysilicon layer over said substrate and in contact with said gate oxide layer;

patterning said polysilicon layer by masking and etching, and forming an array of parallel word lines oriented in a second direction, orthogonal to and above said buried bit lines and aligned over said patterned ROM code insulating layer and thereby completing said array of memory cells having coded cell areas on said read-only-memory (ROM) semiconductor device.

13. The method of claim 12, wherein said buried bit lines are formed by ion implantation of an N-type dopant having a implant dose of between about 1E15 to 5E15 ions/cm$^2$ and an implant energy of between about 60 to 120 KeV.

14. The method of claim 12, wherein said ROM code insulating layer is a silicon oxide layer formed by chemical vapor deposition having a thickness of between about 300 to 800 Angstroms.

15. The method of claim 12, wherein said insulating layer formed by thermal oxidation between said buried bit lines is between about 90 to 200 Angstroms thick.

16. The method of claim 12, wherein said insulating layer formed by thermal oxidation over said buried bit lines is between about 250 to 800 Angstroms thick.

17. The method of claim 12, wherein the polysilicon layer is heavily doped with N-type dopant atoms having a concentration of between about 1E19 to 1E21 atoms/cm$^3$.

18. The method of claim 17, wherein the thickness of said polysilicon layer is between about 2500 to 4500 Angstroms.

19. The method of claim 12, wherein potions of said buried bit lines form the source/drain areas of field effect transistors (FETs) in the ROM memory cells, and portions of said word lines form gate electrodes of said FETs.

20. The method of claim 12, wherein said patterned ROM code insulating layer is formed in select memory cells to prevent said field effect transistors from electrically conducting when a gate voltage is applied to said word lines, and thereby representing a binary zero.

21. The method of claim 12, wherein said array of ROM memory cells are electrically connected to said peripheral address decode and output circuits to complete said read-only-memory semiconductor device.

22. A method of manufacturing an array of coded memory cells for a Read Only Memory (ROM) semiconductor device on a semiconductor substrate with tighter design ground rules, comprising the steps of:

providing a semiconductor substrate having a principle surface with device areas and alignment marks thereon;

forming by masking and ion implantation an array of parallel buried bit lines oriented in a first direction in a portion of said device areas and aligned to said alignment marks;

depositing a ROM code insulating layer on said substrate;

forming a ROM code mask on said ROM code insulating layer, said ROM code mask being formed between said buried bit lines and over coded cell areas, leaving exposed said ROM code insulating layer elsewhere on said substrate and aligned to said alignment marks;

etching said ROM code insulating layer to said substrate, leaving masked portions of said ROM code insulating layer on said coded cell areas;

removing said ROM code mask;

growing a silicon oxide layer on exposed portions of said substrate by thermal oxidation, thereby forming a gate oxide layer between said buried bit lines and an insulating layer over said buried bit lines;

depositing a polysilicon layer over said substrate and in contact with said gate oxide layer;

patterning said polysilicon layer by masking and etching, and forming an array of parallel word lines oriented in a second direction, orthogonal to and above said buried bit lines and over said patterned ROM code insulating layer and aligned to said alignment marks, thereby completing said array of memory cells having coded cell areas on said ROM semiconductor device with tighter ground rules.

23. The method of claim 22, wherein said buried bit lines are formed by ion implantation of an N-type dopant having an implant dose of between about 1E15 to 5E15 ions/cm$^2$ and an implant energy of between about 60 to 120 KeV.

24. The method of claim 22, wherein said ROM code insulating layer is a silicon oxide layer formed by chemical vapor deposition having a thickness of between about 300 to 800 Angstroms.

25. The method of claim 22, wherein the thickness of said polysilicon layer is between about 2500 to 4500 Angstroms.

* * * * *